United States Patent [19]
Ochi et al.

[11] Patent Number: 5,998,866
[45] Date of Patent: Dec. 7, 1999

[54] SEMICONDUCTOR DEVICE HAVING A LEAD CLAMPING ARRANGEMENT

[75] Inventors: Takao Ochi; Hisashi Funakoshi; Kenzo Hatada; Takashi Wakabayashi, all of Osaka, Japan

[73] Assignee: Matsushita Electric Industrial Co., Ltd., Osaka, Japan

[21] Appl. No.: 09/085,893

[22] Filed: Jan. 16, 1998

Related U.S. Application Data

[62] Division of application No. 08/741,555, Oct. 31, 1996, Pat. No. 5,776,802, which is a continuation of application No. 08/350,665, Dec. 7, 1994, abandoned.

[30] Foreign Application Priority Data

Dec. 8, 1993 [JP] Japan ..................................... 5-307932
Aug. 29, 1994 [JP] Japan ..................................... 6-203843

[51] Int. Cl.⁶ ......................... H01L 23/34; H01L 23/495
[52] U.S. Cl. ......................... 257/727; 257/666; 257/676; 257/726
[58] Field of Search ..................................... 257/666, 727, 257/726, 676, 692, 787

[56] References Cited

U.S. PATENT DOCUMENTS 4,766,478  8/1988  Dennis .
5,041,696  8/1991  Utner .
5,291,059  3/1994  Ishitsuka et al. .
5,440,170  8/1995  Tsuji et al. .
5,606,198  2/1997  Ono et al. .
5,757,066  5/1998  Inoue et al. .
5,776,802  7/1998  Ochi et al. .
5,783,861  7/1998  Son .
5,821,628  10/1998  Hotta .

*Primary Examiner*—Sheila V. Clark
*Attorney, Agent, or Firm*—McDermott, Will & Emery

[57] ABSTRACT

A plurality of connecting leads, each consisting of an internal lead and an external lead, are provided so as to extend inward from a lead frame main body, and are then cut off the lead frame main body. The connecting leads are electrically connected with an aluminum electrode of the semiconductor chip. A plurality of fixing leads, each having a distal end bent toward the semiconductor, are provided so as to extend inward from the lead frame main body and thereafter are cut off the lead frame main body. The semiconductor chip is clamped by the distal ends of the fixing leads. The semiconductor chip, the plural connecting leads and the plural fixing leads are sealed together into a resin package.

13 Claims, 17 Drawing Sheets

SEMICONDUCTOR DEVICE HAVING A LEAD CLAMPING ARRANGEMENT

This is a division of U.S. patent application Ser. No. 08/741,555, filed Oct. 31, 1996, now Pat. No. 5,776,802 which is a continuation of U.S. patent application Ser. No. 08/350,665, filed Dec. 7, 1994 now abandoned.

BACKGROUND OF THE INVENTION

The present invention relates to a semiconductor device having an arrangement of molding a semiconductor chip with resin and a manufacturing method of the same.

Advances of electronic components in size and thickness reduction technologies in the past few years have made it possible to provide electronic components having highly improved performances, specifically in the field of semiconductor devices such as memories. This tendency will lead to the need of developing semiconductor devices which are compact in size, thin in thickness, low in cost, reliable in performance, and suitable for high-density packaging.

The package of semiconductor devices, used to be made of ceramic, are being rapidly changed to the resin type to realize the above requirements. Among them, surface mounting type resin molding packages have been increasing their demands since they are advantageous in providing higher mounting density compared with their competitive insertion type packages. The surface mounting type semiconductor packages are generally classified into some specific groups, such as QFP, SOP and SOJ, depending on their detailed constructions.

A semiconductor device having an SOP-type resin package will be explained hereinafter as a first conventional semiconductor device with reference to FIG. 21.

FIG. 21 is a cross-sectional view showing the first conventional semiconductor device. In FIG. 21, a reference numeral 21 represents a semiconductor chip, a reference numeral 22 represents a resin package, a reference numeral 23 represents a connecting lead made of 42 alloy or copper, a reference numeral 25 represents an aluminum electrode, a reference numeral 26 represents a bonding wire made of Au, a reference numeral 27 represents a die pad, and a reference numeral 28 represents a die bonding paste such as Ag paste.

The semiconductor chip 21 is fixed to the die pad 27 by means of the die bonding paste 28. An internal lead 23a of the connecting lead 23 is applied a thin coating of Ag or the like. The aluminum electrode 25 of the semiconductor chip 21 is connected to the internal lead 23a of the connecting lead 23 via the bonding wire 26. The package resin 22 seals the semiconductor chip 21, the bonding wire 26, the die pad 27 and the internal lead 23a therein. An external lead 23b of the connecting lead 23 extends out of the package 22.

In the field of general purpose memory devices, an outer configuration of the package, having a small size regulated by the industrial standards such as JEDEC and EIAJ, tends to cause a very severe problem of how such a small package can accommodate a newly developed semiconductor chip having a capacity rapidly expanded every generation.

Proposed to solve such a problem is an LOC (Lead On Ship) arrangement advantageous to install a large area semiconductor chip into a small-sized package.

With reference to FIG. 22, a second conventional semiconductor device having an LOC arrangement will be explained.

FIG. 22 is a cross-sectional view showing the second conventional semiconductor device. In FIG. 22, a reference numeral 21 represents a semiconductor chip, a reference numeral 22 represents a resin package, a reference numeral 23 represents a connecting lead, a reference numeral 25 represents an aluminum electrode, a reference numeral 26 represents a bonding wire, and a reference numeral 29 represents a polyimide tape. As shown in FIG. 22, an internal lead 23a of the connecting lead 23 is disposed above the main surface of the semiconductor chip 21.

The polyimide tape 29 has both surfaces on which thermoplastic adhesive material such as polyether amide is coated. The internal lead 23a is connected to the main surface of the semiconductor chip 21 by means of this adhesive material. As the polyimide tape 29 of the second conventional semiconductor device serves as a means of connecting the semiconductor chip 21 and the connecting lead 23 in this manner, the die pad 27 is no longer necessary.

Thus, the semiconductor device having an LOC arrangement allows the internal lead 23a of the connecting lead 23 to extend above the main surface of the semiconductor chip 21, so that the internal lead 23a is connected to the aluminum electrode 25 by means of the bonding wire 26. Accordingly, it becomes possible to reduce the unuseful space around the semiconductor chip 21, thereby enabling the large-area semiconductor chip 21 to be housed in the small-sized package 22.

However, such a semiconductor device having an LOC arrangement is inherently disadvantageous in that the package has a tall height. For the reduction of the height of the package, Unexamined Japanese Patent Application No. HEI 5235249/1993 discloses an improved semiconductor device having an arrangement shown in FIG. 23.

Hereinafter, a third conventional semiconductor device will be explained with reference to FIG. 23. In FIG. 23, a reference numeral 21 represents a semiconductor chip, a reference numeral 22 represents a package, a reference numeral 23 represents a connecting lead, a reference numeral 25 represents an aluminum electrode, a reference numeral 26 represents a bonding wire, and a reference numeral 30 represents a bus bar for electric power supply. As shown in FIG. 23, the bus bar 30 extends along the side surface of the semiconductor chip 21 so that the bus bar 30 is connected through a film with the semiconductor chip 21. Thus, it becomes possible to omit the die pad 27 shown in FIG. 21 and the polyimide 29 shown in FIG. 22.

However, the above-described second conventional semiconductor device has the following problems:

(1) Presence of the polyimide tape having high hygroscopicity causes moisture absorbed in the polyimide tape to vaporize during solder reflowing operation; therefore, cracks and voids will be easily caused in the semiconductor device.

(2) Using the polyimide tape having such high hygroscopicity for connecting the internal leads tends to cause leakage between the connecting leads due to hygroscopicity.

(3) A lead frame with a polyimide tape increases the production cost.

(4) A process of setting a semiconductor chip into the lead frame requires a thermocompression bonding between the semiconductor chip and the lead frame by means of a 300–400° C. high-temperature tool to melt the thermoplastic adhesive material coated on both surfaces of the polyimide tape to connect the semiconductor chip with the internal leads. Therefore, the semiconductor chip is possibly damaged by load and heat of the heating tool.

The third conventional semiconductor device has the following problems:

(1) A process of setting the semiconductor chip into a clearance between two bus bars extending in parallel with each other is not easy to carry out.

(2) Heat of sealing resin acts to thermally expand both the semiconductor chip and the lead frame. Difference of thermal expansion between the semiconductor chip and the lead frame will possibly damage the semiconductor chip by the compression force given from the lead frame.

(3) Layout of the bus bar extending along the side surface of the semiconductor chip necessarily locates the distal end of the internal lead outside the bus bar; therefore, the LOC arrangement cannot be employed in this third conventional semiconductor device.

SUMMARY OF THE INVENTION

Accordingly, in view of above-described problems encountered in the prior art, a principal object of the present invention is to provide a semiconductor device and its manufacturing method free from the hygroscopicity problem, inexpensive in the production cost, capable of preventing the semiconductor chip from possible damages, facilitating the step of setting the semiconductor chip into the lead frame, and allowing employment of the LOC arrangement, thereby solving above-described problems.

In order to accomplish this and other related objects, the present invention provides fixing leads having distal ends bent toward the semiconductor, in addition to connecting leads electrically connected to an electrode of a semiconductor chip. With this arrangement, the semiconductor chip is firmly held by the distal ends of the fixing leads.

A first aspect of the present invention provides a semiconductor device comprising: a semiconductor chip; a plurality of connecting leads which had been extended inward from a lead frame main body, which is separated from the lead frame main body, and which is electrically connected with an electrode of the semiconductor chip; a plurality of fixing leads which had been extended inward from the lead frame main body, which is separated from the lead frame main body, each fixing lead having a distal end bent toward the semiconductor for supporting the semiconductor chip; and a resin package sealing the semiconductor chip, the connecting leads and the fixing leads.

With this arrangement, the distal ends of the fixing leads cause an elastic force when deformed with respect to the fixing lead main body, so that the semiconductor chip can be supported by this elastic force. Therefore, not only the damage the semiconductor chip receives from the fixing leads is small, but the semiconductor chip is firmly held by the lead frame. Furthermore, as the semiconductor chip can be set in the lead frame under the condition where the distal ends of the fixing leads are expanded outward so as to widen a clearance therebetween, setting of the semiconductor chip is easy.

As the plural connecting leads and plural fixing leads are provided to extend inward from the lead frame main body, interference between the connecting leads and the fixing leads can be prevented. Thus, it becomes possible to employ the LOC arrangement.

As the fixing leads have the distal ends being bent, it is easy to discriminate the fixing leads from the connecting leads having internal leads extending straight. Thus, in the image analysis, detection errors are greatly reduced. Electrical connection between the connecting leads and the electrode of the semiconductor chip is surely performed.

Without using the polyimide tape, the semiconductor chip can be held by the lead frame. Thus, the problem caused by the inherency of polyimide tape can be eliminated.

It will be preferable to adopt an LOC arrangement wherein the connecting leads have internal leads extending above and along a main surface of the semiconductor chip and electrically connected to the electrode of the semiconductor chip.

With this arrangement, it is not necessary to provide the bonding wire at the side of the semiconductor chip. Therefore, the thickness of a seal resin between the side edge of the semiconductor chip and the outer surface of the package can be minimized, resulting in size reduction of the package. As a common electrode is extendable from the internal leads of the connecting leads on the semiconductor chip, not only dispersion layout of the common electrode is realized but the electrode can be disposed within the internal region of the semiconductor chip. Accordingly, a resistance component is reduced and noise is reduced. Thus, the signal transmission path in the semiconductor chip can be shortened, realizing high speed operation and low power consumption.

The distal end of the fixing lead can support a side surface of the semiconductor chip. Thus, support of the semiconductor chip by the distal ends is ensured. Mistake is reduced in the setting of the semiconductor chip into the lead frame.

In this case, it is preferable that the distal end of the fixing lead has a surface brought into contact with the side surface of the semiconductor chip. With this arrangement, a contact area between the distal end of the fixing lead and the side surface of the semiconductor chip is enlarged. Therefore, support of the semiconductor chip by the distal ends of the fixing leads can be further ensured. Mistake is further reduced in the setting of the semiconductor chip into the lead frame.

When the distal ends of the fixing leads are arranged to support the corners of the semiconductor chip, interference between the fixing leads and the connecting leads can be avoided, increasing the degree of freedom in designing the lead frame.

It will be preferable that soft metal or an elastic member is interposed between the distal end of the fixing lead and the side surface of the semiconductor chip, because a mechanical stress the semiconductor chip receives from the distal ends of the fixing leads can be reduced. Thus, the damage the semiconductor chip receives from the fixing leads can be reduced.

The distal end of the fixing lead may be connected with the side surface of the semiconductor chip by resin or low melting point metal. With adoption of such resin or low melting point metal, the semiconductor chip can be installed into the lead frame under the condition where the distal ends of the fixing leads are spaced from the side surfaces of the semiconductor chip. Hence, the damage the semiconductor receives from the fixing leads can be reduced in the step of setting the semiconductor chip into the lead frame.

Furthermore, the distal end of the fixing lead may be connected with the side surface of the semiconductor chip by adhesive insulating film. In this case, not only connecting the distal ends of the fixing leads with the semiconductor chip is easy but insulating property between the fixing leads and the semiconductor chip is sufficiently increased.

The fixing lead may serve as a ground lead, since a ground lead can be brought into contact with the side surface of the semiconductor chip whose electrical potential should be grounded. Thus, it is unnecessary to prepare a ground lead independently.

The distal end of the fixing lead may be an angled plate formed into an L shape when seen in the plan view, so that the angled plate can support the corner of the semiconductor chip. With this arrangement, support of the semiconductor chip by the distal ends of the fixing leads can be stabilized.

A second aspect of the present invention provides a manufacturing method of a semiconductor device comprising: a first step of providing a lead frame main body, a plurality of connecting leads extending inward from the lead frame main body for providing electrical connection, and a plurality of fixing leads extending inward from the lead frame main body and having distal ends bent toward the semiconductor; a second step of holding the semiconductor chip by the distal ends of the fixing leads; a third step of sealing the semiconductor chip, the connecting leads and the fixing leads with resin to form a resin package; and a fourth step of cutting the connecting leads and fixing leads from the lead frame main body. With this manufacturing method, the semiconductor device of the first aspect of the present invention previously explained can be easily manufactured.

This manufacturing method may further comprise a step of electrically connecting an electrode of the semiconductor chip with internal leads of the connecting leads by means of a bonding wire, so that the step is executed between the second and third steps.

The first step may comprise a step of setting a clearance between distal ends of confronting fixing leads to be slightly smaller than a corresponding size of the semiconductor chip, and the second step may comprise a distal ends expanding step of expanding the distal ends of the confronting fixing leads outward so that the clearance between the distal ends of the confronting fixing leads becomes slightly larger than the corresponding size of the semiconductor chip, a semiconductor chip setting step of placing the semiconductor chip into an enlarged space formed between the distal ends, and a semiconductor chip holding step of clamping the semiconductor chip by the distal ends of the confronting fixing leads which are sprung back inward.

With these steps, the semiconductor chip can be installed into the lead frame under the condition where the clearance between the distal ends of the fixing leads is widened larger than the corresponding size of the semiconductor chip. Hence, the damage the semiconductor chip receives from the fixing leads can be reduced.

In this case, the first step may comprise a step of providing each fixing lead so as to cause an elastic force when deformed with respect to the lead frame main body, and the semiconductor chip holding step in the second step may comprise a step of clamping the semiconductor chip by the elastic force of the fixing lead deformed with respect to the lead frame.

With these steps, plural fixing leads cause an elastic force when deformed with respect to the lead frame main body, thereby making it possible to clamp the semiconductor chip firmly by the distal ends of the fixing leads. Not only the damage the semiconductor chip receives from the fixing leads is further decreased but the semiconductor chip is further firmly held by the lead frame. The setting step of placing the semiconductor chip between the widened distal ends of the fixing leads is easily carried out.

The first step may comprise a step of providing the distal ends of the fixing leads so as to cause an elastic force when deformed with respect to the fixing lead main body, and the semiconductor chip holding step in the second step may comprise a step of clamping the semiconductor chip by the elastic force of the distal ends of the fixing leads deformed with respect to the lead frame.

With these steps, distal end of plural fixing leads cause an elastic force when deformed with respect to the lead frame main body, thereby making it possible to clamp the semiconductor chip firmly by the distal ends of the fixing leads. Not only the damage the semiconductor chip receives from the fixing leads is further decreased but the semiconductor chip is further firmly held by the lead frame. The setting step of placing the semiconductor chip between the widened distal ends of the fixing leads is easily carried out.

The distal ends expanding step in the second step comprises a step of heating the lead frame so that the distal ends of the fixing leads expand outward.

With this step, the distal ends of the fixing leads can be expanded outward so as to widen a clearance therebetween without causing mechanical deformation. Thus, smooth execution is assured in both the distal ends expanding step and the semiconductor chip holding step in the second step.

The semiconductor chip holding step in the second step may comprise a step of providing a soft member softer than the semiconductor chip intervening between the distal ends of the confronting fixing leads and the semiconductor chip, so as to clamp the semiconductor chip between the distal ends of the confronting fixing leads via the soft member.

With this step, the damage the semiconductor chip received from the fixing leads is further reduced. If the soft member is an elastic member, the damage the semiconductor chip received from the fixing leads is yet further reduced.

The first step may comprise a step of setting a clearance between distal ends of confronting fixing leads to be slightly larger than a corresponding size of the semiconductor chip, and the second step may comprise a semiconductor chip setting step of placing the semiconductor chip into a space formed between the distal ends, and a semiconductor chip holding step of connecting the distal ends of the confronting fixing leads with the semiconductor chip, thereby holding the semiconductor chip between the distal ends of the confronting fixing leads.

By doing this, the semiconductor chip can be installed into the lead frame under the condition where a sufficient clearance is provided between the semiconductor chip and the distal ends of the fixing leads. Thus, the damage the semiconductor receives from the fixing leads is reduced in the semiconductor chip setting step.

The semiconductor chip holding step in the second step may comprise a step of connecting the distal ends of the confronting fixing leads with the semiconductor chip by low melting point metal. By doing this, thermal damage given to the semiconductor chip is reduced. Hence, the distal ends of the fixing leads can be surely connected with the semiconductor chip.

The semiconductor chip holding step in the second step may comprise a step of connecting the distal ends of the confronting fixing leads with the semiconductor chip by adhesive insulating resin. By doing this, thermal damage given to the semiconductor chip is completely eliminated. Hence, not only the distal ends of the fixing leads can be surely connected with the semiconductor chip but insulating property between the fixing leads and the semiconductor chip is increased.

The semiconductor chip holding step in the second step may comprise a step of connecting the distal ends of the confronting fixing leads with the semiconductor chip via insulating film having adhesive property. By doing this, not only connection between the distal ends of the fixing leads and the low melting point metal is facilitated but insulating property between the fixing leads and the semiconductor chip is increased.

The second step may comprise a step of holding a side surface of the semiconductor chip by a distal end of the fixing lead. By doing this, the semiconductor chip is surely held.

The second step may comprise a step of holding side surfaces forming a corner of the semiconductor chip by the distal ends of the fixing leads. By doing this, it becomes possible to avoid an interference between the fixing leads and the connecting leads, assuring the degree of freedom in the design of the lead frame.

BRIEF DESCRIPTION OF THE DRAWINGS

The above and other objects, features and advantages of the present invention will become more apparent from the following detailed description which is to be read in conjunction with the accompanying drawings, in which.

DETAILED DESCRIPTION OF THE PREFERRED EMBODIMENTS

Hereinafter, preferred embodiments of the present invention will be explained in greater detail with reference to the accompanying drawings.

Figure 1:
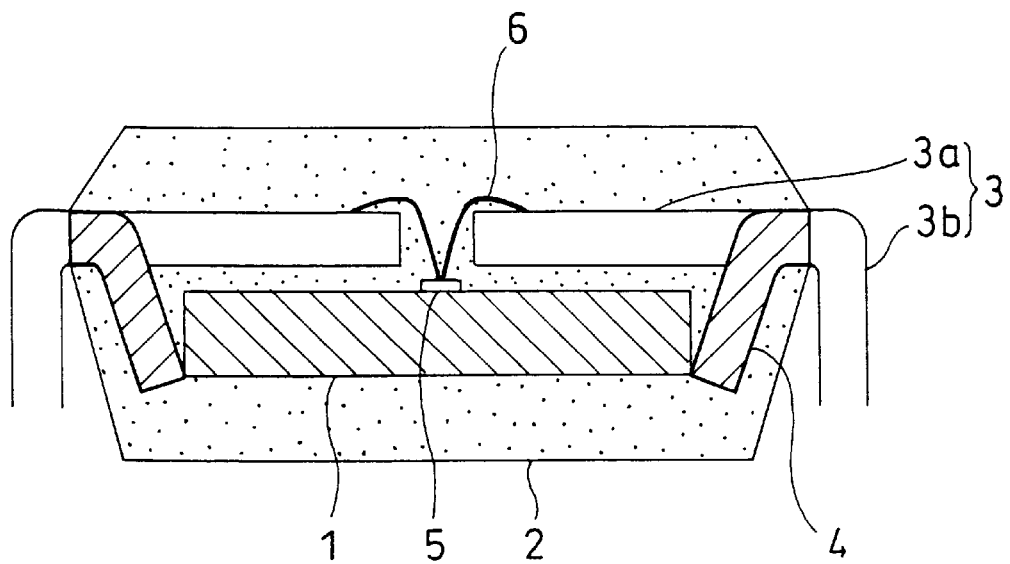
FIG. 1 is a cross-sectional view showing a semiconductor device in accordance with a first embodiment of the present invention.
Figure 2A:
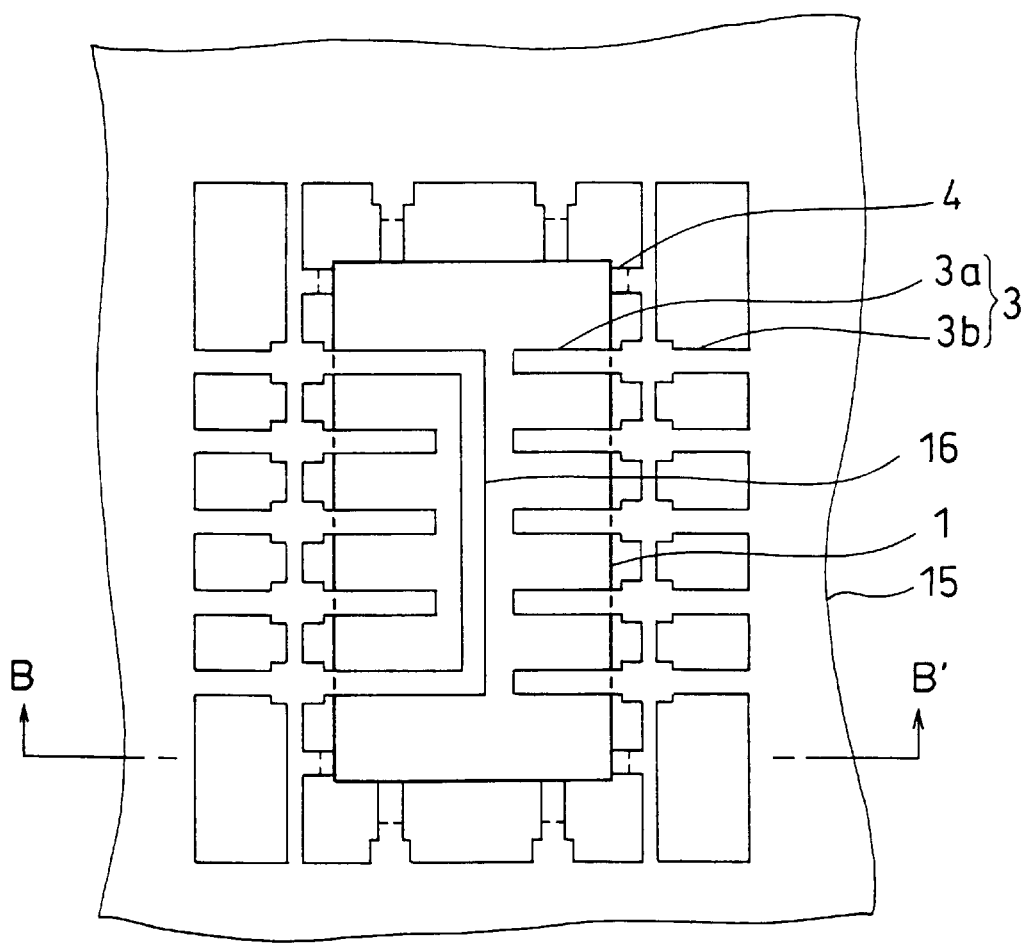
FIG. 2A is a plan view showing the semiconductor device in accordance with the first embodiment of the present invention.
Figure 2B:
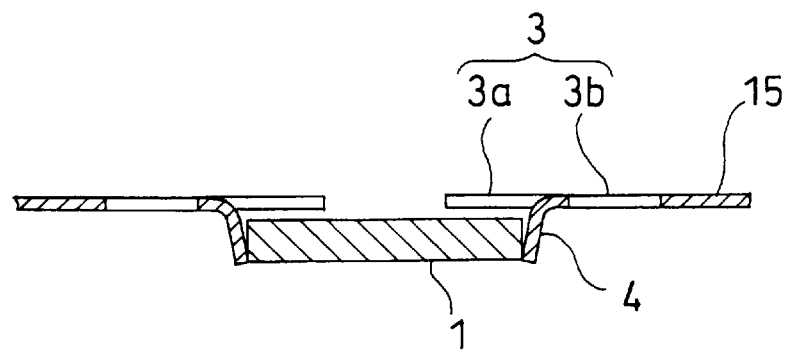
FIG. 2B is a cross-sectional view taken along a line B-B' of FIG. 2A.

FIGS. 1, 2A and 2B are views showing a semiconductor device in accordance with the first embodiment of the present invention. FIG. 1 is a cross-sectional view of the semiconductor device, FIG. 2A is a plan view of a semiconductor chip and a lead frame of the semiconductor device, and FIG. 2B is a cross-sectional view taken along a line B-B' of FIG. 2A.

In the drawings, a reference numeral 1 represents a semiconductor chip of rectangular parallelopiped having main and reverse surfaces and side surfaces, a reference numeral 2 represents a resin package, a reference numeral 3 represents a connecting lead, a reference numeral 4 represents a fixing lead, a reference numeral 5 represents an aluminum electrode provided at a central portion of the semiconductor chip 1, a reference numeral 6 represents a bonding wire made of Au. The lead frame, made of 42 alloy or copper, comprises a lead frame main body 15 and a plurality of connecting leads extending inward from the lead frame main body 15, but does not include a die pad. An internal lead 3a of the connecting lead 3 extends horizontally in parallel with the upper surface (main surface) of the semiconductor chip 1 until it reaches the inner (or central) region of the semiconductor chip 1, and is electrically connected to the aluminum electrode 5 by means of the bonding wire 6.

Distal ends 4a of the fixing leads 4 are bent downward toward the semiconductor chip 1, and support the side surfaces of the semiconductor chip 1 by elastic force of the bent portions.

Above-described semiconductor chip 1, the connecting lead 3, the fixing lead 4 and the bonding wire 6 are hermetically sealed or molded together into a package 2. An external lead 3b of the connecting lead 3 is positioned out of the package 2 and is formed into a predetermined shape. In FIG. 2A, a reference numeral 16 represents a ground or a common electrode of an electric power source which connects two internal leads 3a, 3a of the connecting leads 3 spaced far from each other and located both ends of and above the semiconductor chip 1.

Hereinafter, a manufacturing method of the semiconductor device in accordance with the first embodiment will be explained with reference to FIGS. 3A to 3E.

Figure 3A:
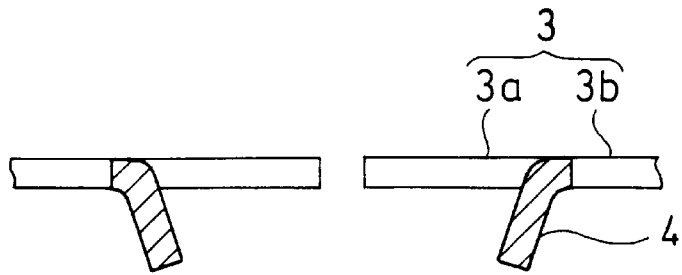
FIGS. 3A–3E. are cross-sectional views showing manufacturing steps of the semiconductor device in accordance with the first embodiment of the present invention.

As illustrated in FIG. 3A, there is provided a lead frame comprising the lead frame main body 15 (not shown in FIG. 3A), a plurality of connecting leads 3,3, - - - extending inward from the lead frame main body 15, and a plurality of fixing leads 4,4, - - - having distal ends 4a, 4a, - - - being bent and extending inward from the lead frame 4. A clearance between mutually confronting distal ends 4a, 4a of the fixing leads 4, 4 is slightly smaller than the corresponding size of the semiconductor chip 1. The semiconductor chip 1 is then mounted on a jig (not shown). The clearance between the mutually confronting distal ends 4a, 4a of the fixing leads 4, 4 is widened using a pin or the like, and the lead frame is set on the jig, thereby assembling the semiconductor chip 1 with the lead frame.

Figure 3B:
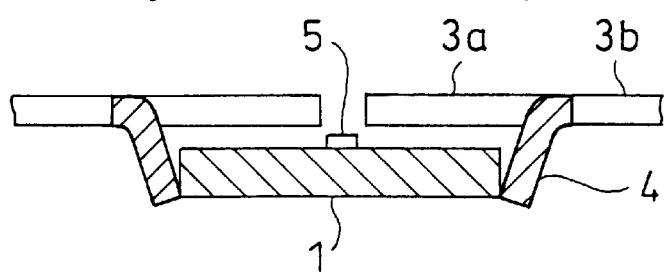

Subsequently, above-described pin or the like is removed so that the distal ends 4a, 4a of the fixing leads 4,4 spring back from elastically outwardly widened positions to their home positions. Thus, as shown in FIG. 3B, the distal ends 4a, 4a of the fixing leads 4,4 support the semiconductor chip 1 from both sides thereof, thereby completely clamping the semiconductor chip 1 by the lead frame.

Figure 3C:
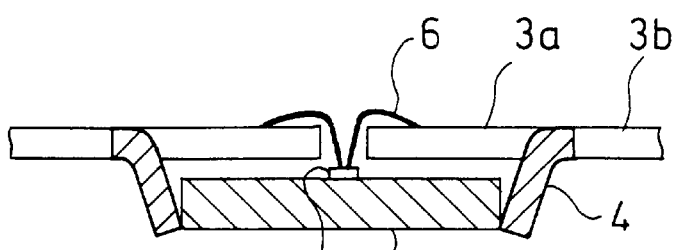

Next, as illustrated in FIG. 3C, the internal leads 3a, 3a of the connecting leads 3,3 are connected with the aluminum electrode 5 of the semiconductor chip 1 by means of the bonding wire 6, thereby accomplishing electrical connection between the connecting leads 3,3 and the aluminum electrode 5. In this first embodiment of the present invention, bonding between the connecting leads 3,3 and the aluminum electrode 5 is carried out in a space above the semiconductor chip 1. The bonding operation in such a space above the semiconductor chip 1 can be easily carried out by increasing the output of supersonic wave so that a load acting on the internal leads 3a, 3a can be decreased as small as possible. If the output of the supersonic wave cannot be increased, it will be preferable to bend the distal end of the internal lead 3a so that the connecting operation can be carried out in a condition where the bent distal end is brought into contact with the semiconductor chip 1.

Figure 3D:
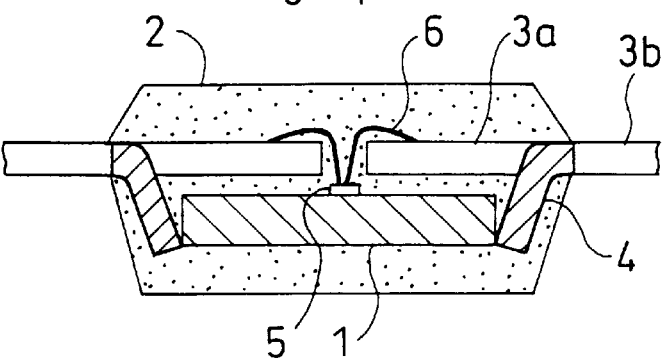

Next, as illustrated in FIG. 3D, the semiconductor chip 1, the internal leads 3a, 3a, - - - of the connecting leads 3,3, - - - the fixing leads 4,4, - - - and the bonding wires 6,6 - - - are sealed or molded together by resin package 2.

Figure 3E:
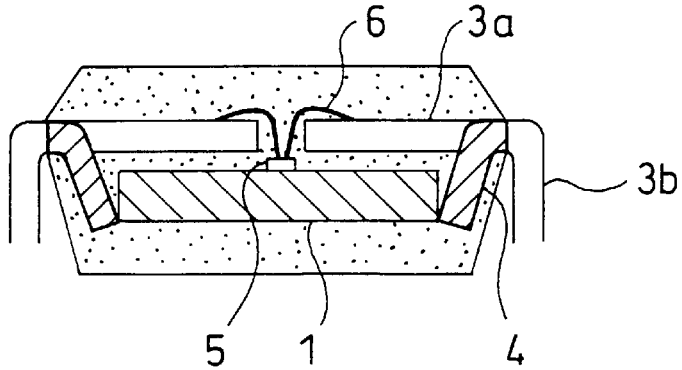

Thereafter, as illustrated in FIG. 3E, the internal leads 3a, 3a, - - - of the connecting leads 3,3, - - - and the fixing leads 4,4, - - - are cut off the lead frame main body 15, and the external leads 3b, 3b, - - - of the connecting leads 3,3, - - - are bent to furnish a semiconductor device of the first embodiment of the present invention.

According to the semiconductor device of the first embodiment, the distal ends 4a, 4a, - - - of the fixing leads 4,4, - - - having elasticity and causing an elastic force when deformed with respect to the fixing lead main body are used to support the semiconductor chip 1. Therefore, damage of the semiconductor chip 1 received from the fixing lead 4 is relatively small, and the semiconductor chip 1 is surely held by the lead frame. Furthermore, setting of the semiconductor chip 1 into the lead frame is easy because the setting is carried out under the condition where the clearance of the mutually confronting distal ends 4a, 4a of the fixing leads 4,4 is forcibly widened.

Furthermore, from the view point of reducing detection errors in the image analysis in a step of connecting the connecting leads 3,3 with the aluminum electrode 5 by means of the bonding wires 6,6 - - -, it is advantageous that the distal ends 4a, 4a of the fixing leads 4,4 are bent and configured in a shape different from the connecting leads 3,3 - - - having inner internal leads 3a, 3a extending straight.

Moreover, an arrangement of clamping the semiconductor chip 1 by the distal ends 4a, 4a of the fixing leads 4,4 can eliminate the die pad. Thus, not only peeling off of the package 2 can be prevented from occurring at the reverse surface of the die pad but an inside stress of the package 2 can be decreased, thereby increasing the reliability of the package 2. Requiring no presence of the die pad brings reduction of thickness in the package 2. Furthermore, absence of die bonding paste eliminates the hardening step of the die bonding paste, bringing cost reduction and high reliability.

Layout of the internal leads 3a, 3a, - - - of the connecting leads 3,3, - - - extending along the upper surface of the semiconductor chip 1 until they reach the internal or central region of the semiconductor chip 1 makes it possible to execute wire bonding operation in the internal or central region of the semiconductor chip 1. It is therefore possible to minimize the thickness of the seal resin between the side edge of the semiconductor chip 1 and the outer surface of the package 2. for example to an extent of approximately 0.5 mm. Furthermore, as the common electrode 16 extends from the internal leads 3a of the connecting leads 3 above the semiconductor chip 1, it becomes possible to dispose the ground or electrodes of the electric power within the internal region of the semiconductor chip 1. Thus, a resistance value is decreased and noise is correspondingly reduced. Still further, as the aluminum electrode 5 can be disposed at the central region of the semiconductor chip 1, the signal transmission path of the semiconductor chip 1 can be reduced to a half of the conventional one. Thus, high-speed operation and low power consumption are both realized in the semiconductor chip 1. Degree of freedom in the design of the semiconductor chip 1 is increased and the width of wiring can be narrowed, reducing the area of the semiconductor chip 1. Furthermore, layout of the internal leads 3a, 3a, - - - extending above the semiconductor chip 1 will be advantageous from the standpoint of effect of heat radiation.

According to the above-described first embodiment, the pin or the like is used to expand the confronting distal ends 4a, 4a of the fixing leads 4,4 outwardly so as to widen a clearance therebetween and thereafter removes the pin or the like out of the fixing leads 4,4 to allow the elastically deformed portions of the fixing leads 4,4 to spring back to their home positions, thereby setting the semiconductor chip 1 into the lead frame. Alternatively, it is possible to heat the lead frame so as to allow the distal ends 4a, 4a of the fixing leads 4,4 to expand outward to widen their clearance sufficiently to hold the semiconductor chip 1 therebetween and then to cool down the lead frame to allow the distal ends 4a, 4a of the fixing leads 4,4 to return inward to firmly clamp the semiconductor chip 1.

Figure 4A:
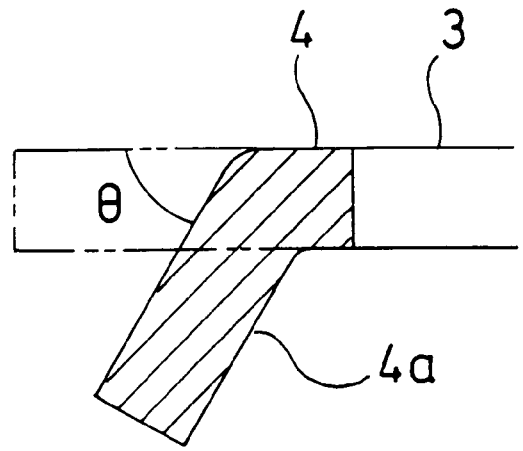
FIGS. 4A–4C are cross-sectional views respectively illustrating an angular relation of the distal end of the fixing lead to the lead frame in accordance with the first embodiment of the present invention.
Figure 4B:
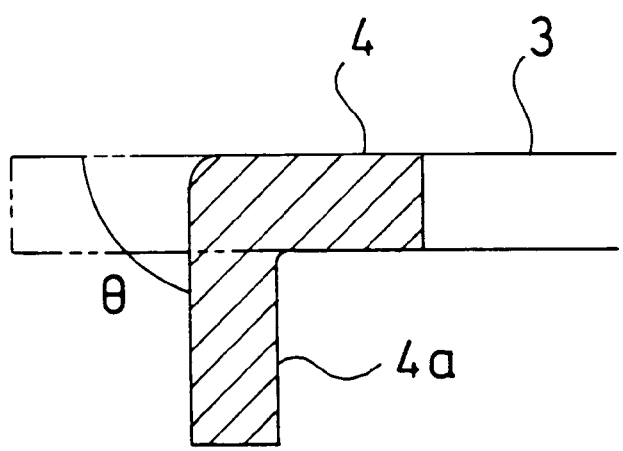
Figure 4C:
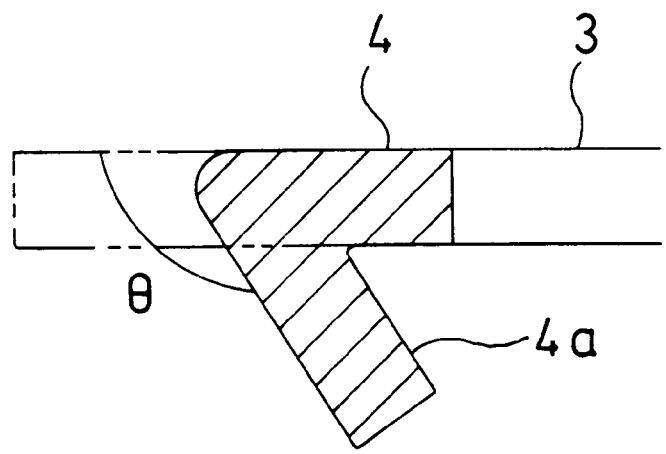

A bent angle θ formed between the distal end 4a of the fixing lead 4 and the lead frame main body 15 can be a sharp angle as shown in FIG. 4A, or a right angle as shown in FIG. 4B. The determination of the bent angle θ will depend on the holding method of the semiconductor chip 1 using the distal ends 4a, 4a of the fixing leads 4,4 and the shape of the fixing leads 4,4. However, if the bent angle θ is a dull angle as shown in FIG. 4C, it will be no longer possible to hold the semiconductor chip 1 by the distal ends 4a, 4a of the fixing leads 4,4.

Figure 5A:
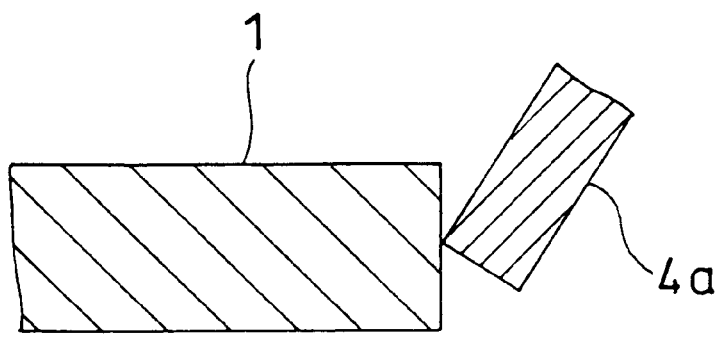
FIGS. 5A–5C are cross-sectional views respectively illustrating a method of supporting a semiconductor chip between distal ends of the fixing leads in accordance with the first embodiment of the present invention.
Figure 5B:
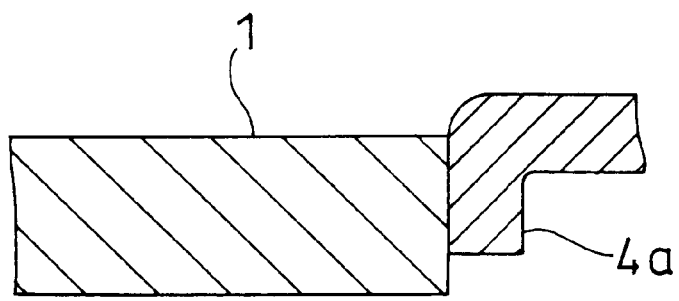
Figure 5C:
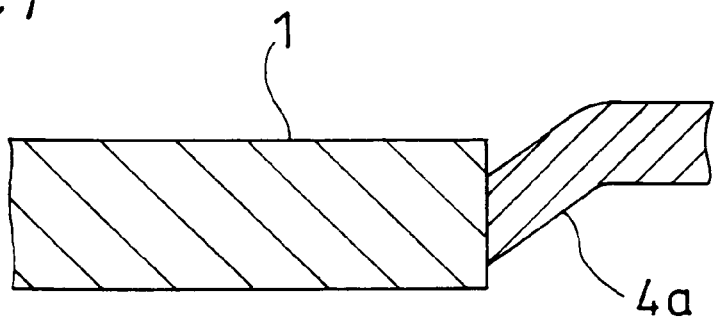

The method of holding the semiconductor chip 1 using the distal ends 4a, 4a of the fixing leads 4,4 can be any of a line contact supporting method shown in FIG. 5A, a surface contact supporting method shown in FIG. 5B, or an edge surface supporting method shown in FIG. 5C. In the case of the edge surface supporting method shown in FIG. 5C, the distal end 4a of the fixing lead 4 needs to be cut beforehand into a configuration fitting to the side surface of the semiconductor chip 1. The line contact supporting method shown in FIG. 5A will be advantageous in that the semiconductor chip 1 is firmly clamped by a relatively large force, although the damage of the semiconductor chip 1 may be large. The surface contact supporting method shown in FIGS. 5B and 5C can provide a large contact area which is advantageous to stabilize the support of the semiconductor chip 1 and reduce the damage of the semiconductor chip 1.

Figure 6A:
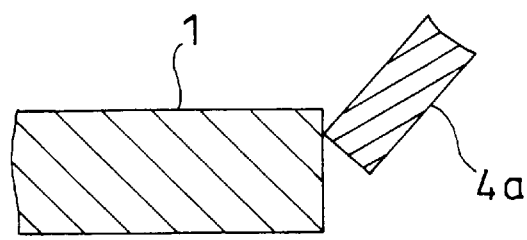
FIGS. 6A–6F are cross-sectional views respectively illustrating an altitudinal relation between the distal ends of the fixing leads and the semiconductor chip sandwiched therebetween in accordance with the first embodiment of the present invention.
Figure 6B:
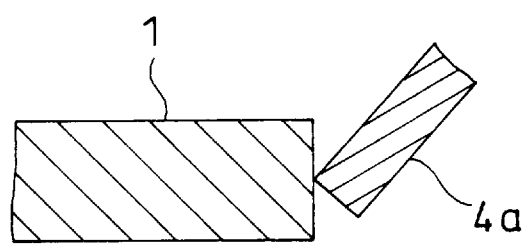
Figure 6C:
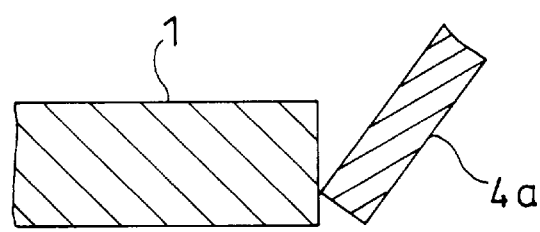
Figure 6D:
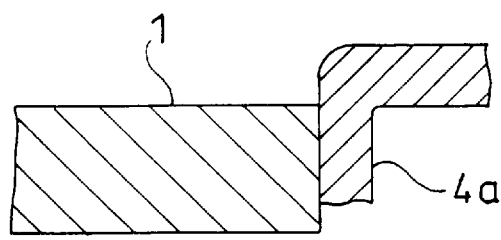
Figure 6E:
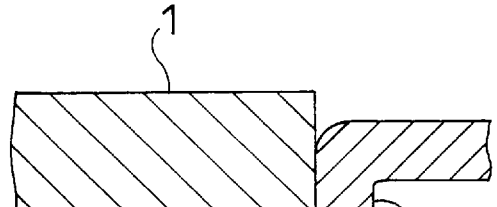
Figure 6F:
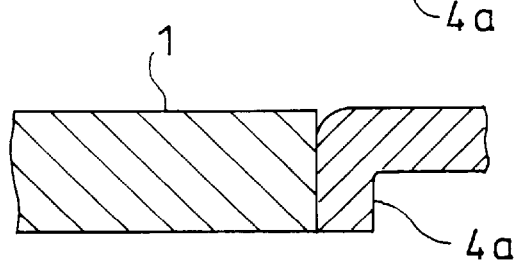

Regarding the height of the line contact between the distal end 4a of the fixing lead 4 and the side surface of the semiconductor chip 1 can be a higher point close to the main surface of the semiconductor chip 1 as shown in FIG. 6A, a midpoint of the semiconductor chip 1 as shown in FIG. 6B, or a lower point close to the reverse surface of the semiconductor chip 1 as shown in FIG. 6C. The height of the surface contact between the distal end 4a of the fixing lead 4 and the side surface of the semiconductor chip 1 can be a higher region from the main surface of the semiconductor chip 1 to the midpoint as shown in FIG. 6D, a lower region from the midpoint from the reverse surface of the semiconductor chip 1 as shown in FIG. 6E, or a whole region ranging from the main surface to the reverse surface of the semiconductor chip 1 as shown in FIG. 6F. The determination of the support position should be optimized by taking account of the configuration of the semiconductor chip 1 or the lead frame, the damage received by the semiconductor chip 1, supporting certainty of the semiconductor chip 1, balance and reliability of the structure of the package 2.

Figure 7A:
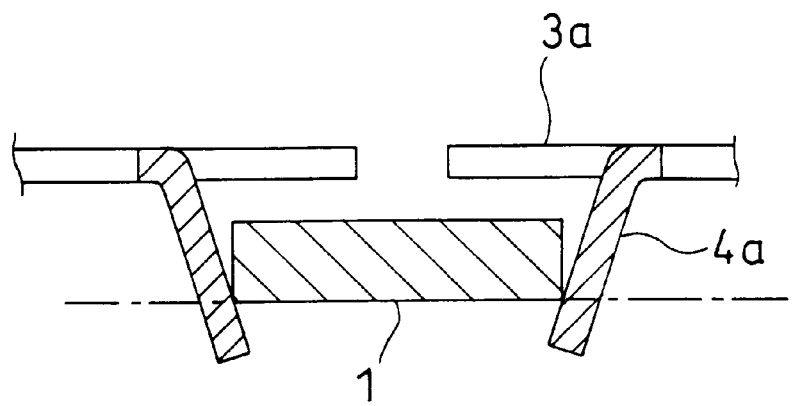
FIGS. 7A–7C are cross-sectional views respectively illustrating a positional relation between the lowermost distal ends of the fixing leads and the reverse surface of the semiconductor chip in accordance with the first embodiment of the present invention.
Figure 7B:
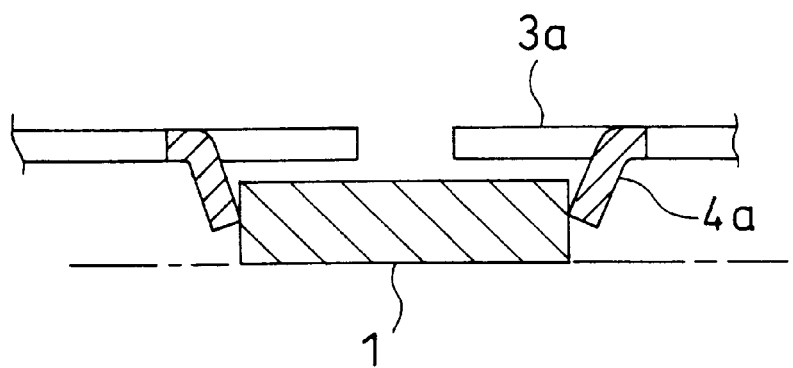

The distal end 4a of the fixing lead 4 and the semiconductor chip 1 can be variously engaged. For example, the semiconductor chip 1 can be sandwiched at the inner surfaces of the distal ends 4a, 4a so that the lower edges of the distal ends 4a, 4a extend below the reverse surface of the semiconductor chip 1 as shown in FIG. 7A. Alternatively, the semiconductor chip 1 can be engaged with the lower edges of the distal ends 4a, 4a at intermediate portions of the side surfaces of the semiconductor chip 1 so that the lower edges of the distal ends 4a, 4a position higher than the reverse surface of the semiconductor chip 1 as shown in FIG. 7B. Furthermore, the semiconductor chip 1 can be engaged with the lower edges of the distal ends 4a, 4a at a height close to the reverse surface of the semiconductor chip 1 so that the lowermost edges of the distal ends 4a, 4a Just position at the same height as the reverse surface of the semiconductor chip 1.

Figure 7C:
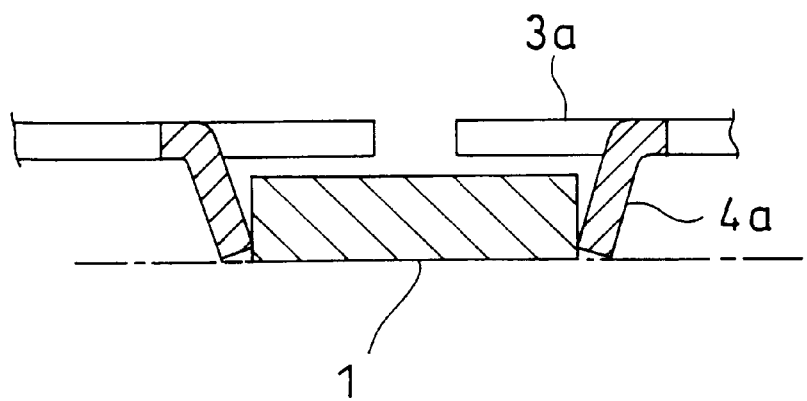

However, the engagement of FIG. 7A is disadvantageous in that the lower edges of the distal ends 4a, 4a protruding lower than the reverse surface of the semiconductor chip 1 possibly collide with the chip stage when the semiconductor chip 1 is set into the lead frame on the chip stage. The engagement of FIG. 7B is disadvantageous in that correctly determining the height of the engaging point is difficult, although there is no danger that the distal ends 4a, 4a collide with the chip stage. On the other hand, the engagement of FIG. 7C is advantageous in that not only there is no danger that the distal edges 4a, 4a collide with the chip stage but positioning of the engaging height is easy.

A preferable gap between the main surface of the semiconductor chip 1 and the internal lead 3a will be somewhere between 50 to 200 μm. Because, 50 μm is a minimum distance required between the internal lead 3a and the main surface of the semiconductor chip 1 for overcoming adverse effect of α-ray emitted from the internal lead 3a or electric capacity of the internal lead 3a. Meanwhile, 200 μm is a maximum distance required between the internal lead 3a and the main surface of the semiconductor chip 1 for realizing thickness reduction of the package 2 and utilizing heat radiation effect from the internal leads 3a, 3a.

Figure 8:
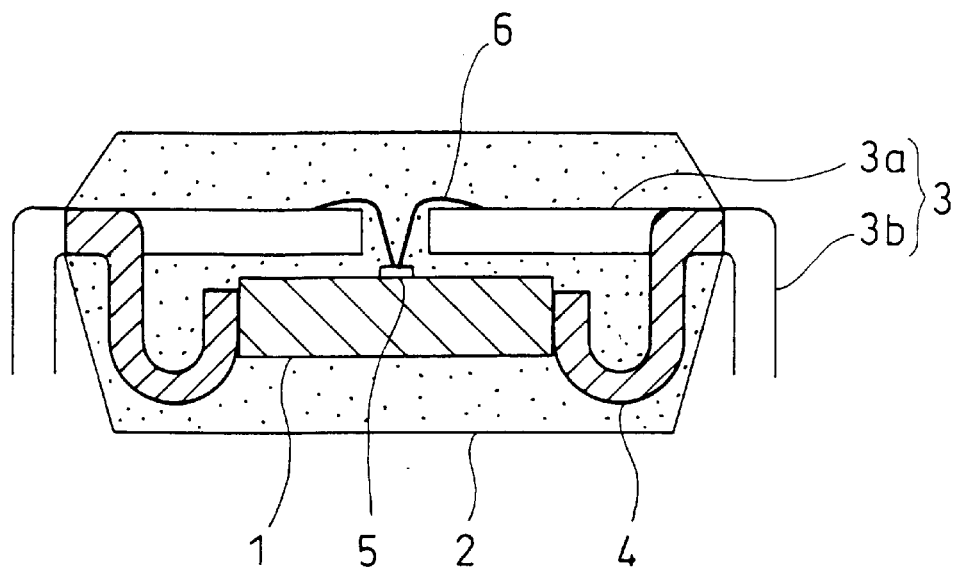
FIG. 8 is a cross-sectional view showing a semiconductor device in accordance with a second embodiment of the present invention.

FIG. 8 is a cross-sectional view showing a semiconductor device in accordance with the second embodiment of the present invention. In this second embodiment, the distal edges 4a, 4a of the fixing leads 4,4 are formed into U shape, thereby causing an elastic force when deformed with respect to the fixing lead main body. With this elastic force, the semiconductor chip 1 can be firmly clamped. In the same manner as in the first embodiment, a clearance between mutually confronting distal ends 4a, 4a of the fixing leads 4,4 is slightly smaller than the corresponding size of the semiconductor chip 1. The semiconductor chip 1 is inserted between the confronting distal edges 4a, 4a of the fixing leads 4,4 by expanding them outward so as to widen a clearance therebetween by the pushing force of the semiconductor chip 1, thereby setting the semiconductor chip 1 in position in the lead frame. Thus, the semiconductor chip 1 is firmly clamped by the elastic force of the distal ends 4a, 4a of the fixing leads 4,4.

Figure 9A:
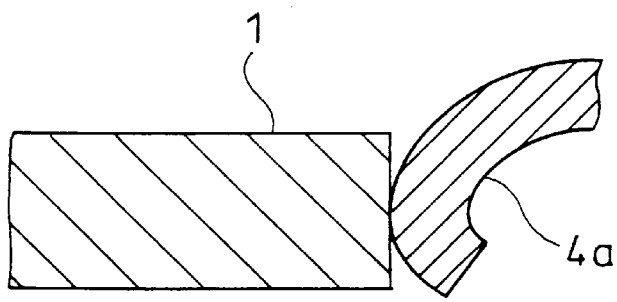
FIGS. 9A and 9B are cross-sectional views respectively showing configuration of the distal end of the fixing lead in accordance with a modified embodiment of the second embodiment in accordance with the present invention.
Figure 9B:
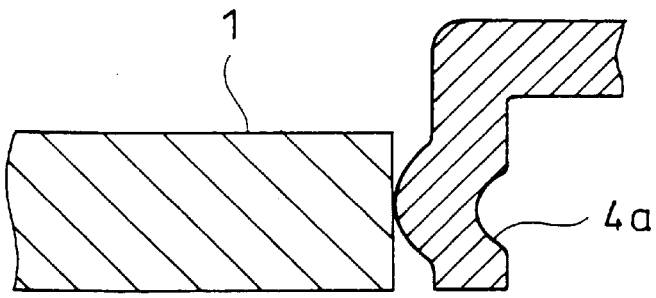

FIGS. 9A and 9B are views showing modifications of the second embodiment. Namely, the U-shaped distal ends 4a, 4a of the fixing leads 4,4 of the second embodiment can be replaced with curved distal ends 4a, 4a shown in FIG. 9A or with partly arc-shaped distal ends 4a, 4a shown in FIG. 9B. These modified distal ends 4a, 4a can bring the same effect as the distal ends 4a, 4a of the second embodiment.

Figure 10A:
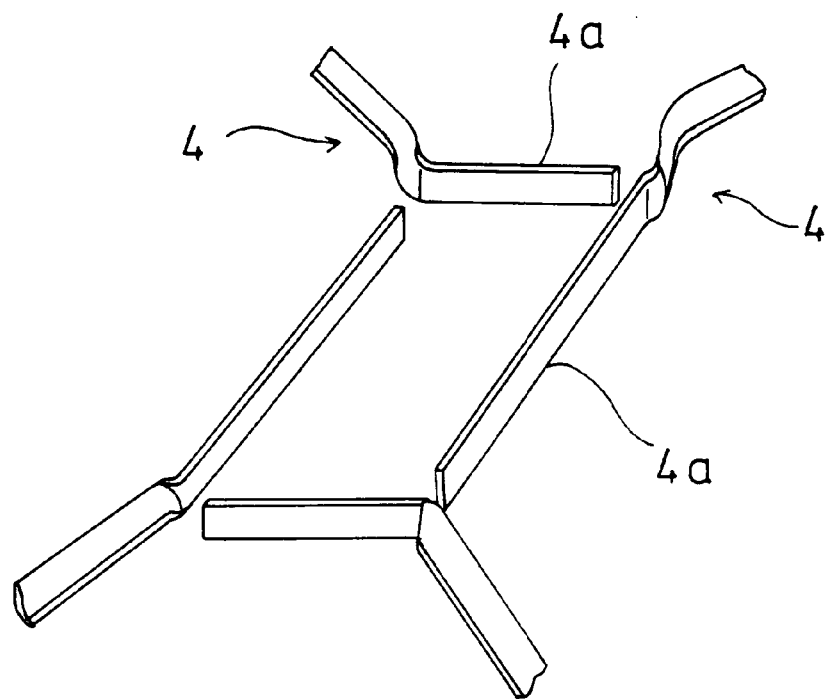
FIGS. 10A and 10B are perspective views respectively showing distal ends of the fixing leads of a semiconductor device in accordance with a third embodiment of the present invention.
Figure 10B:
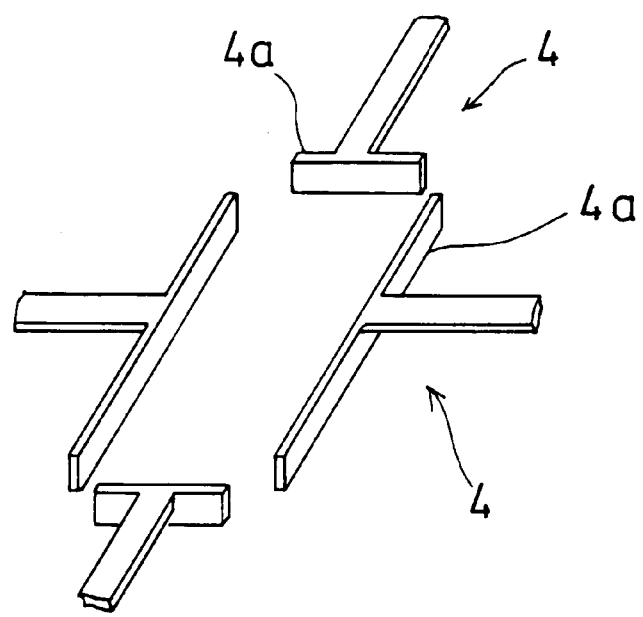

FIGS. 10A and 10B are views showing examples of the distal ends 4a, 4a of the leads 4, 4 in a semiconductor device in accordance with the third embodiment of the present invention. In this third embodiment, the distal ends 4a, 4a of the fixing leads 4, 4 are bent toward the semiconductor chip 1 and then extend straight along the side surfaces of the semiconductor chip 1. In this case, the distal ends 4a, 4a of the fixing leads 4,4 can be bent at a portion confronting the corner of the semiconductor chip 1 so that they then extend along the side surfaces of the semiconductor chip 1 as shown in FIG. 10A, or the distal ends 4a, 4a of the fixing leads 4, 4 can be bent at a portion confronting the side central portion of the semiconductor chip 1 so that they then extend along the side surfaces of the semiconductor chip 1 as shown in FIG. 10B.

By employing such an arrangement, a contact area between the distal ends 4a, 4a of the fixing leads 4,4 and the side surfaces of the semiconductor chip 1 is so increased that a sufficient frictional force can be obtained. Thus, positional deviation between the distal ends 4a, 4a of the fixing leads 4,4 and the semiconductor chip 1 can be surely prevented and displacement of the semiconductor chip 1 too.

Figure 11:
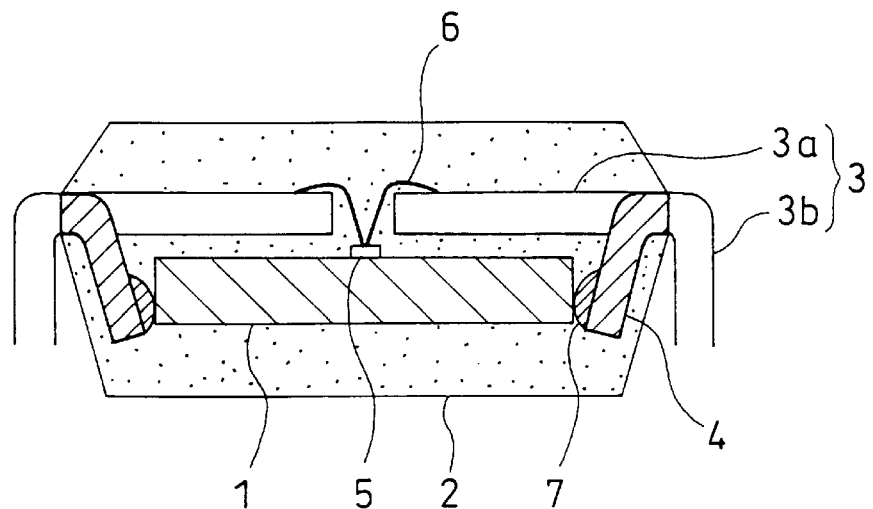
FIG. 11 is a cross-sectional view showing a semiconductor device in accordance with a fourth embodiment of the present invention.

FIG. 11 is a cross-sectional view showing an arrangement of a semiconductor device in accordance with the fourth embodiment of the present invention. In this fourth embodiment, a soft metal 7 softer than the semiconductor chip 1 is provided between the distal end 4a of the fixing lead 4 and the side surface of the semiconductor chip 1. To manufacture the semiconductor device in accordance with the third embodiment, the soft metal 7 is attached beforehand on the distal end 4a of the fixing lead 4. Then, in the same manner as the first embodiment, the semiconductor chip 1 is set into the lead frame under the condition where the confronting distal ends 4a, 4a are expanded outward so as to widen a clearance therebetween.

Adopting such an arrangement makes it possible to reduce the stress that the semiconductor chip 1 receives from the distal ends 4a, 4a of the fixing lead 4, 4 when the semiconductor chip 1 is set in the lead frame and also to reduce the stress that the semiconductor chip 1 receives from the distal ends 4a, 4a of the fixing lead 4, 4 due to heat of resin filled to form the package 2.

Figure 12:
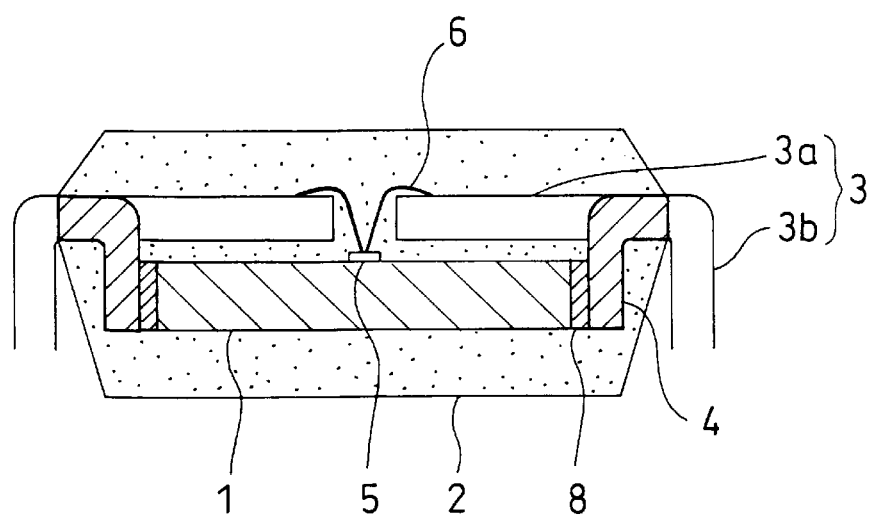
FIG. 12 is a cross-sectional view showing a semiconductor device in accordance with a modified embodiment of the fourth embodiment of the present invention.

FIG. 12 shows a modification of the fourth embodiment. In this modification, the soft metal 7 is replaced with a resin member 8 having elasticity and insulating ability. This modified embodiment can also be effective to reduce the damage of the semiconductor chip 1.

Figure 13:
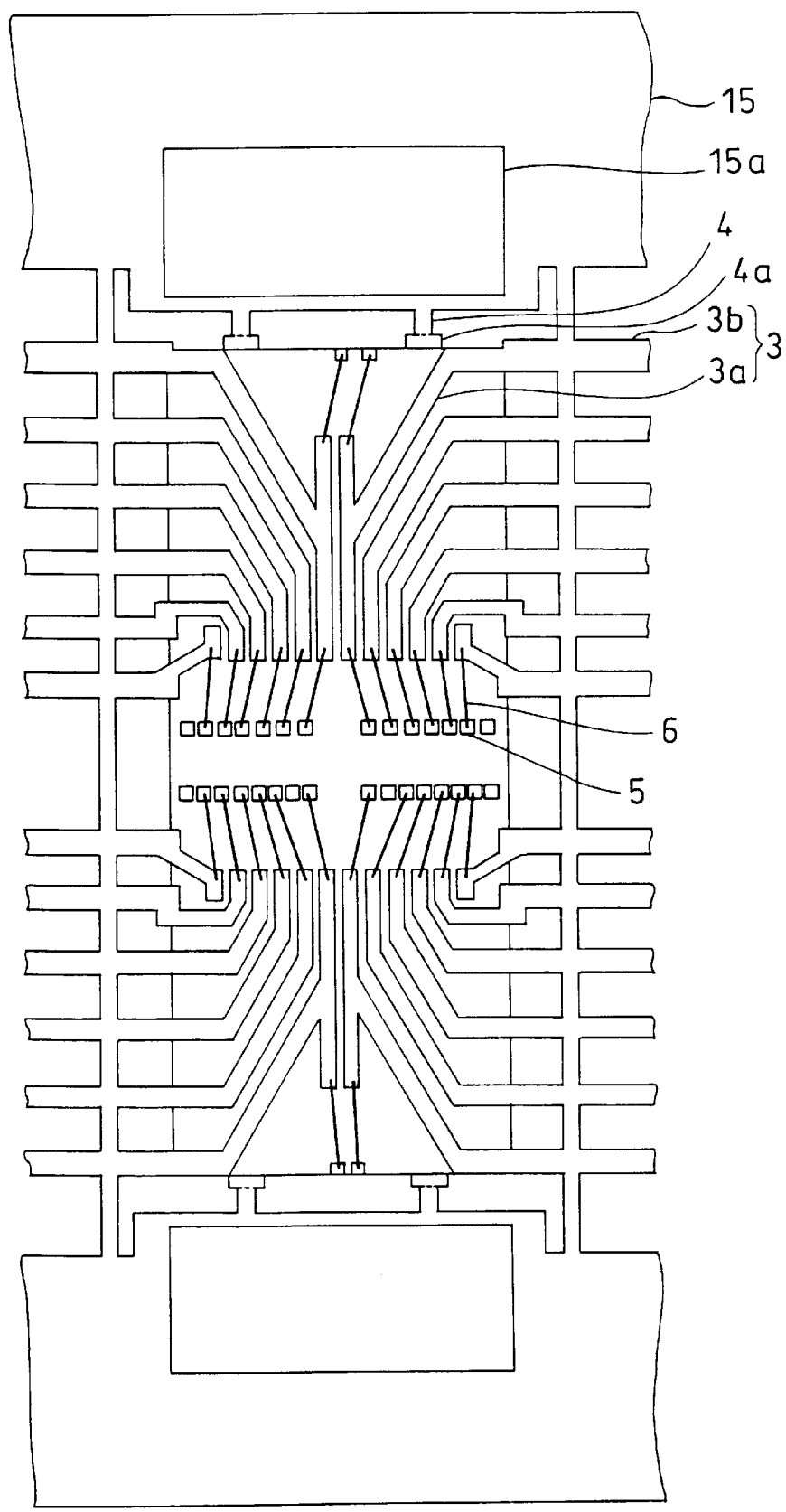
FIG. 13 is a plan view showing a lead frame of a semiconductor device in accordance with a fifth embodiment of the present invention.

FIG. 13 is a plan view showing the structure of the lead frame in accordance with a semiconductor device of the fifth embodiment of the present invention. In this fifth embodiment, a rectangular opening 15a is provided closely to and behind the fixing leads 4 so that a straightly extending narrow portion is provided just behind the fixing leads 4, 4 on the lead frame main body 15. Thus, the fixing leads 4, 4 are elastically supported with respect to the lead frame main body 15. In other words, the semiconductor chip 1 is firmly clamped by an elastic force given from the distal ends 4a, 4a of the fixing leads 4, 4. In the same manner as in the previously explained embodiments, a clearance between mutually confronting distal ends 4a, 4a of the fixing leads 4, 4 is slightly smaller than the corresponding size of the semiconductor chip 1. The semiconductor chip 1 is set into the lead frame under the condition where the distance of the mutually confronting distal ends 4a, 4a of the fixing leads 4, 4 is expanded slightly larger than the corresponding size of the semiconductor chip 1 by means of a pin or the like. With this arrangement, the semiconductor chip 1 is firmly clamped by the fixing leads 4, 4 which cause an elastic force with respect to the lead frame main body 15.

Figure 14:
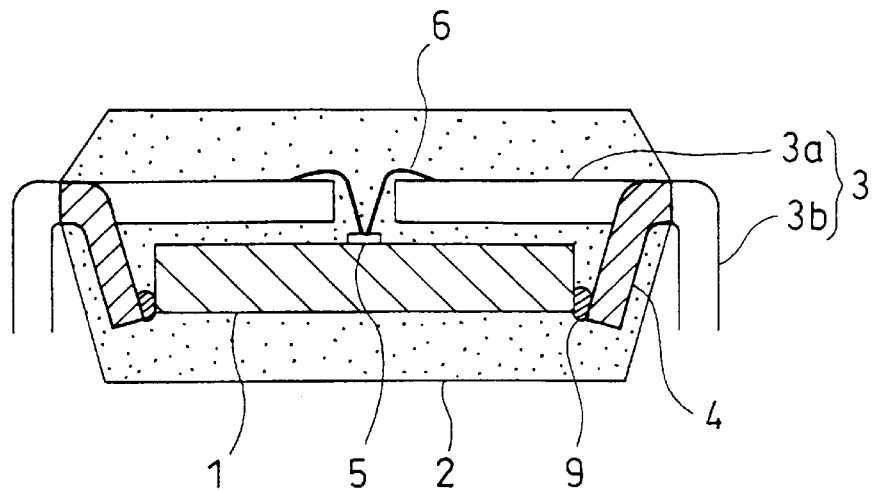
FIG. 14 is a cross-sectional view showing a semiconductor device in accordance with a sixth embodiment of the present invention.

FIG. 14 is a cross-sectional view showing an arrangement of a semiconductor device in accordance with the sixth embodiment of the present invention. In this sixth embodiment, the distal end 4a of the fixing lead 4 is connected to the semiconductor chip 1 via a low melting point metal 9 such as solder. Manufacturing method of the semiconductor device in accordance with the sixth embodiment is different from that of the first to fifth embodiments in that a clearance between mutually confronting distal ends 4a, 4a of the fixing leads 4, 4 is set slightly larger than the corresponding size of the semiconductor chip 1, and the low melting point metal 9 is beforehand coated on the inside surfaces of the distal ends 4a, 4a facing to the semiconductor chip 1. Under this condition the semiconductor 1 is set into the lead frame, and subsequently the low melting point metal 9 is melted to connect the distal ends 4a, 4a of the fixing leads 4, 4 with the semiconductor chip 1. A preferable melting point of the low melting point metal 9 would be not larger than 400° C. in view of the damage received by the semiconductor chip 1.

Figure 15:
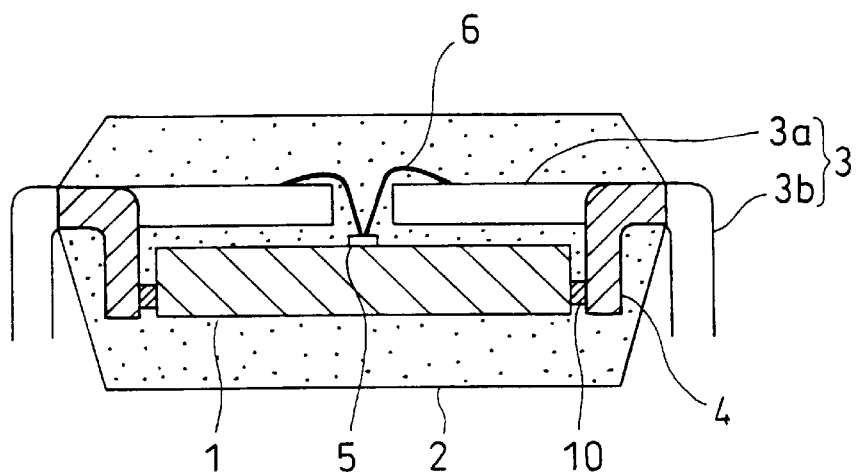
FIG. 15 is a cross-sectional view showing a semiconductor device in accordance with a first modified embodiment of the sixth embodiment of the present invention.

FIG. 15 is a first modification of the sixth embodiment, wherein the low melting point metal 9 of the sixth embodiment is replaced with an insulating resin 10 having thermal plasticity, optical hardenability and thermal hardenability. To manufacture the semiconductor device in accordance with the first modification of the sixth embodiment, the insulating resin 10 having thermal plasticity, optical hardenability and thermal hardenability is coated beforehand on the distal ends 4a, 4a of the fixing leads 4, 4. Under this condition the semiconductor 1 is set into the lead frame, and subsequently heat or light energy is applied to the insulating resin 10, thereby connecting the distal ends 4a, 4a of the fixing leads 4, 4 with the semiconductor chip 1.

Figure 16:
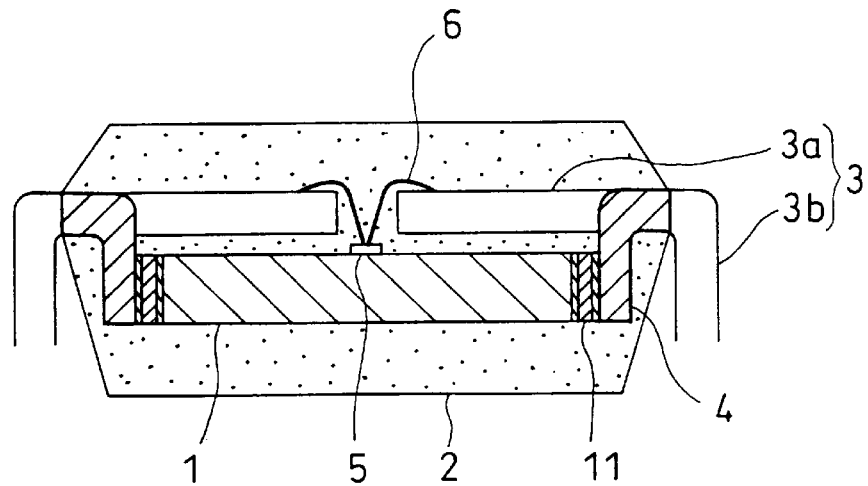
FIG. 16 is a cross-sectional view showing a semiconductor device in accordance with a second modified embodiment of the sixth embodiment of the present invention.

FIG. 16 is a second modification of the sixth embodiment, wherein the low melting point metal 9 of the sixth embodiment is replaced with an insulating film 11 having both surfaces coated with resin having thermal plasticity, optical hardenability and thermal hardenability. Namely, the insulating film 11 has adhesive property. Manufacturing method of the semiconductor device in accordance with the second modification of the sixth embodiment is the same as that of the semiconductor device in accordance with the first modification of the sixth embodiment.

In the arrangements of the sixth embodiment, and first and second modifications of the sixth embodiment wherein the clearance between the mutually confronting distal ends 4a, 4a of the fixing leads 4, 4 is set slightly larger than the corresponding size of the semiconductor chip 1, it will be possible to connect only one side surface of the semiconductor chip 1 with the distal end 4a of the fixing lead 4.

Although the low melting point metal 9, the insulating resin 10 or the insulating film 11 is provided beforehand on the distal end 4a of the fixing lead 4 in the above-described sixth embodiment and first and second modifications of the sixth embodiment, it will be possible to insert the low melting point metal 9, the insulating resin 10 or the insulating film 11 between the distal end 4a of the fixing lead 4 and the semiconductor chip 1 when the semiconductor chip 1 is set into the lead frame.

Figure 17A:
FIGS. 17A–17C are cross-sectional views illustrating a step of coating low-melting point metal or insulating resin on the distal end of the fixing lead in the manufacturing method of the semiconductor device in accordance with the sixth embodiment or the first modified embodiment of the sixth embodiment of the present invention.
Figure 17B:
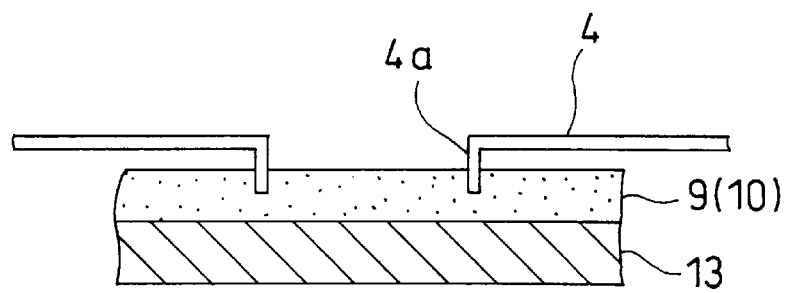
Figure 17C:
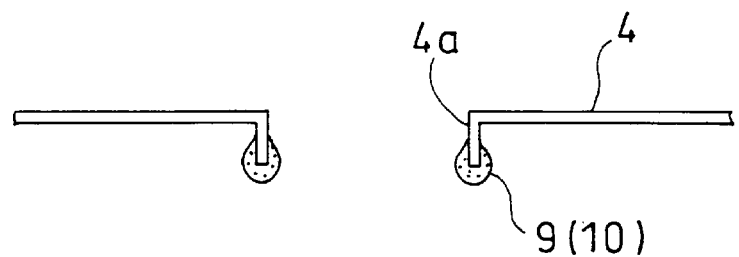

FIGS. 17A to 17C show an example of a manufacturing step of coating the low melting point metal 9 or the insulating resin 10 beforehand on the distal end 4a of the fixing lead 4. Namely, as illustrated in FIG. 17A, a lead frame including fixing leads 4, 4 whose distal ends 4a, 4a are bent downward is prepared. Then, as shown in FIG. 17B, the distal ends 4a, 4a of the fixing leads 4, 4 are soaked into the low melting point metal 9 or the insulating resin 10 provided on the coating stage 13, thereby attaching a required amount of ball-like low melting point metal 9 or insulating resin 10 on the distal ends 4a, 4a of the fixing leads 4,4.

Figure 18A:
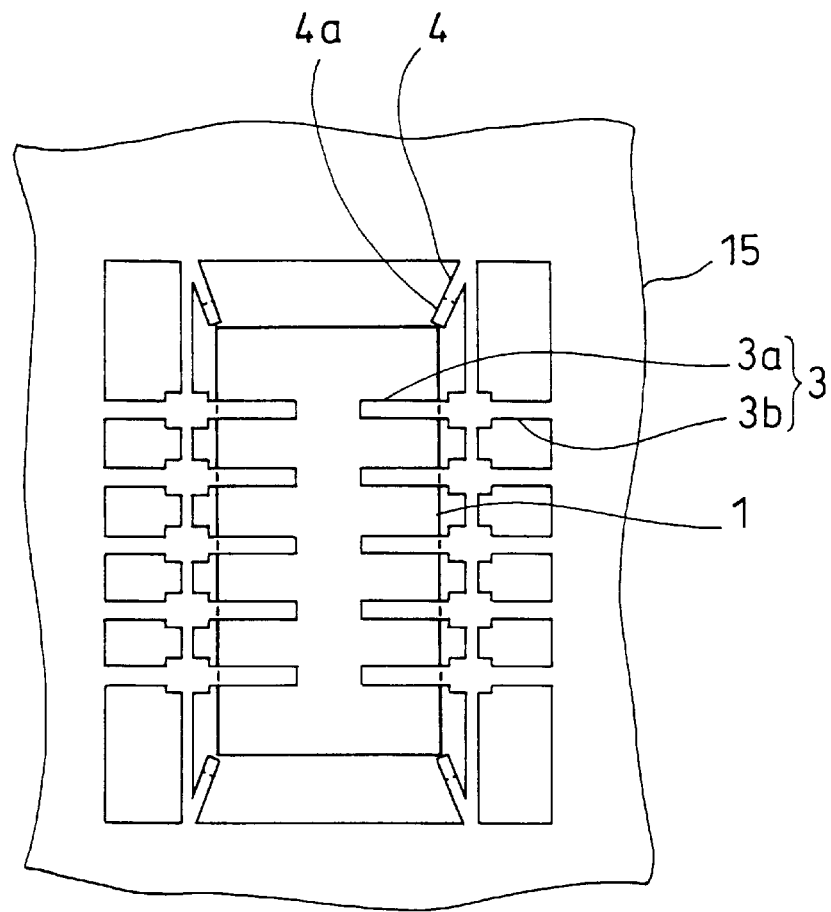
FIG. 18A is a plan view showing a semiconductor device in accordance with a seventh embodiment of the present invention, omitting a package thereof.
Figure 18B:
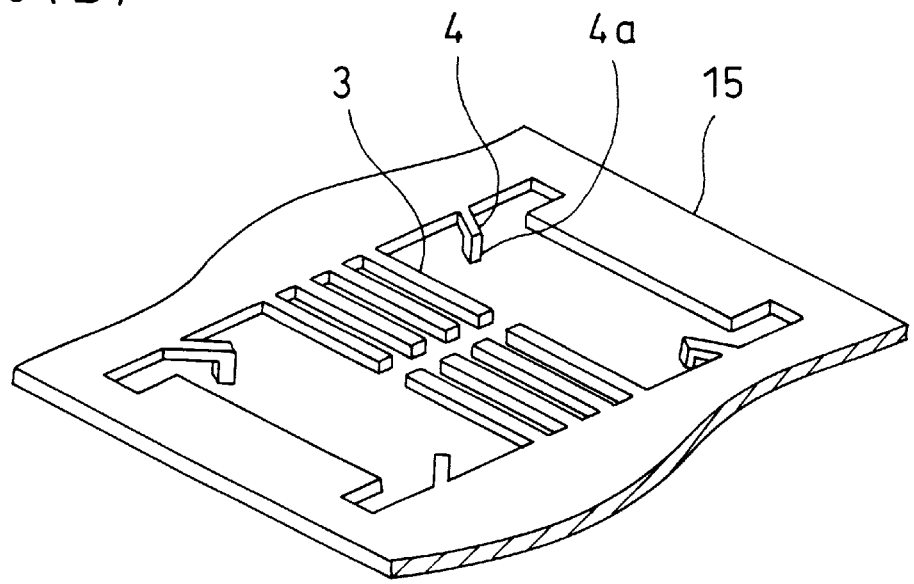
FIG. 18B is a perspective view showing a lead frame of the seventh embodiment.
Figure 19:
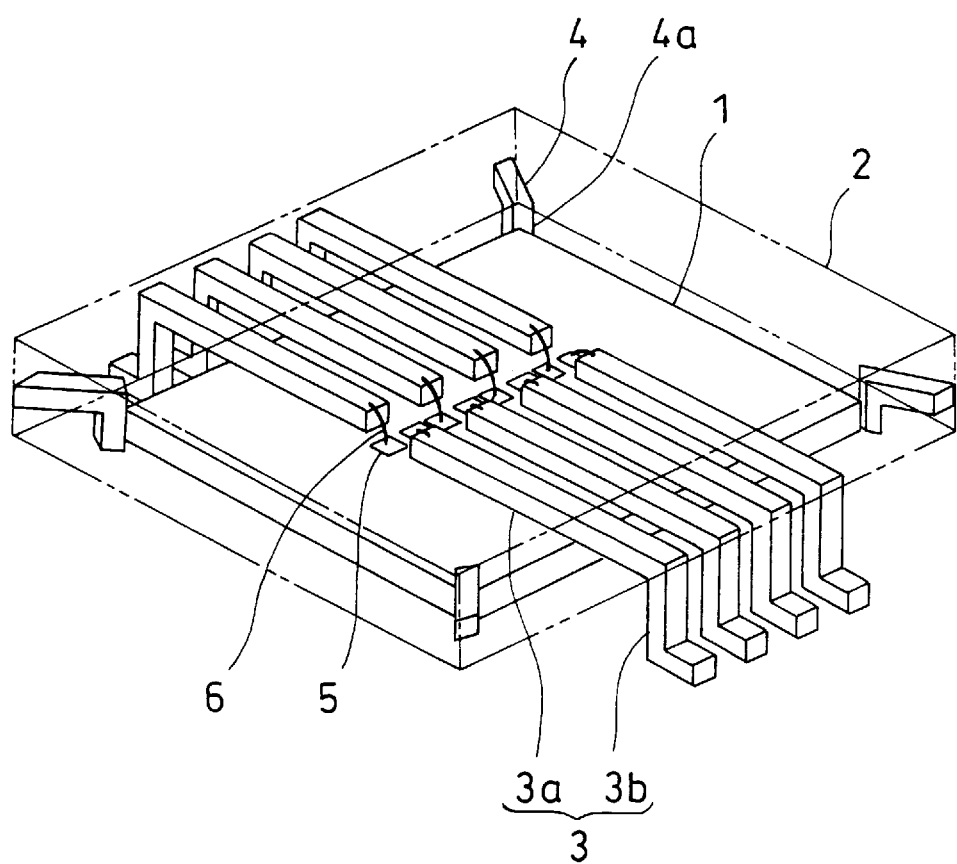
FIG. 19 is a perspective view showing the semiconductor device in accordance with the seventh embodiment of the present invention, omitting the package and the lead frame.

FIGS. 18A, 18B and 19 are views showing a semiconductor device in accordance with the seventh embodiment of the present invention. FIG. 18A is a plan view omitting the package 2, FIG. 18B is a perspective view showing a lead frame, and FIG. 19 is a perspective view omitting the package 2 and the lead frame main body 15.

In the seventh embodiment, the fixing leads 4,4, - - - are provided at portions corresponding to the four corners of the semiconductor chip 1. Thus, the semiconductor chip 1 is supported at its four corners by the distal ends 4a, 4a, - - - of the fixing leads 4, 4, - - - . This seventh embodiment is the same as the first to sixth embodiments in that the aluminum electrode 5 is provided at substantially the center of the semiconductor chip 1 and the bonding wire 6 is used to electrically connect the internal lead 3a of the connecting lead 3 and the aluminum electrode 5.

In the seventh embodiment, a distance between diagonally disposed two distal ends 4a, 4a of the fixing leads 4, 4 is slightly smaller than the corresponding diagonal length of the semiconductor chip 1. The semiconductor chip 1 set into the lead frame under the condition where the distal ends 4a, 4a of the fixing leads 4, 4 are expanded outward so as to widen a clearance therebetween by means of a pin or the like. Thus, the semiconductor chip 1 is firmly clamped by the distal ends 4a, 4a of the fixing leads 4, 4 which cause an elastic force when deformed with respect to the lead frame main body 15.

Figure 20A:
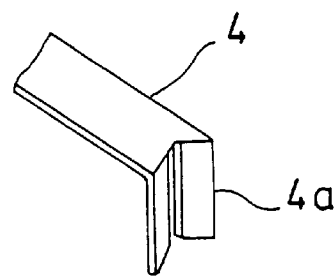
FIGS. 20A–20E are views respectively showing configuration of the distal end of a fixing lead of the semiconductor device in accordance with the seventh embodiment of the present invention.
Figure 20B:
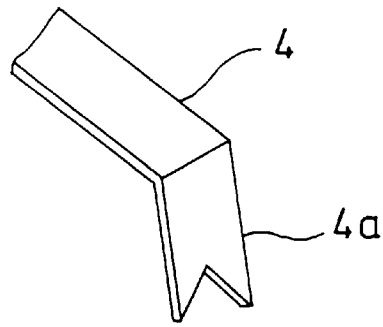
Figure 20C:
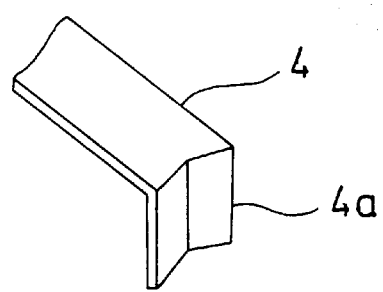
Figure 20D:
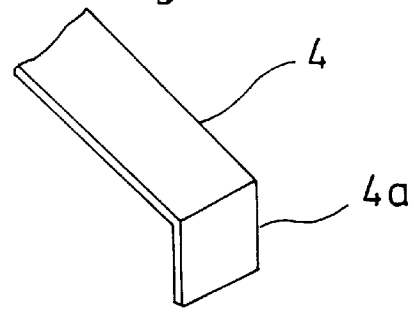
Figure 20E:
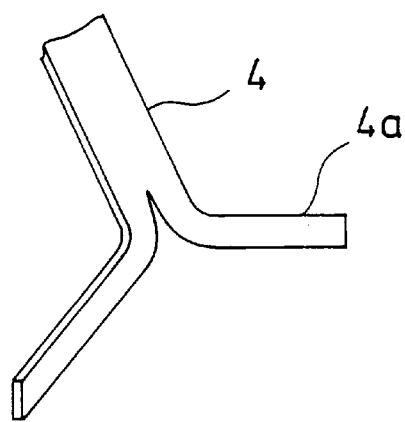
Figure 21:
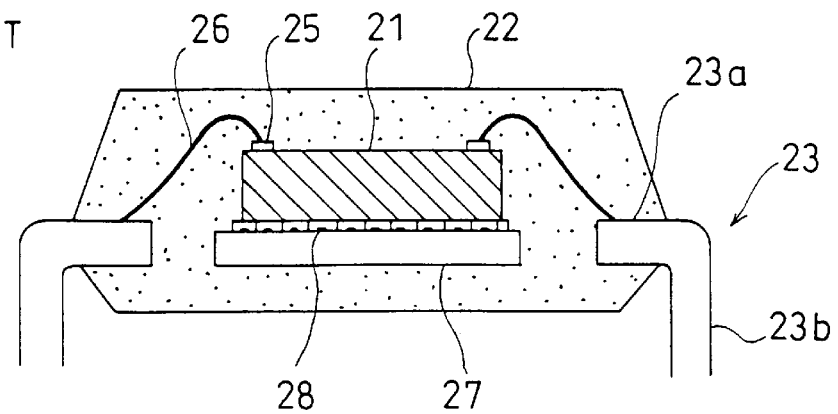
FIG. 21 is a cross-sectional view showing the first conventional semiconductor device.
Figure 22:
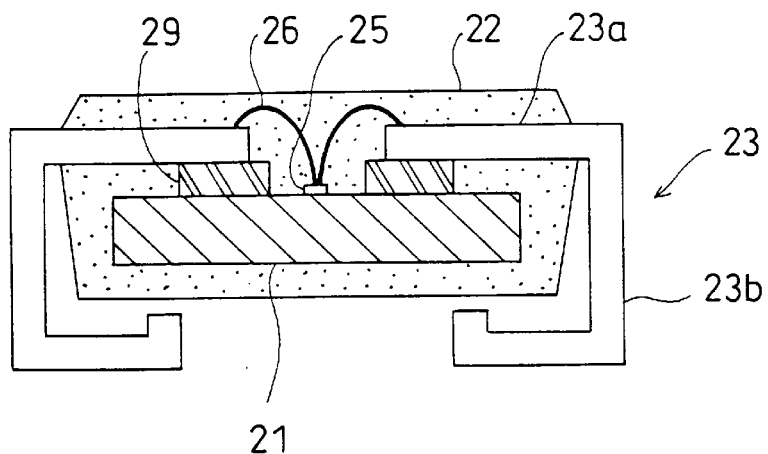
FIG. 22 is a cross-sectional view showing the second conventional semiconductor device.
Figure 23:
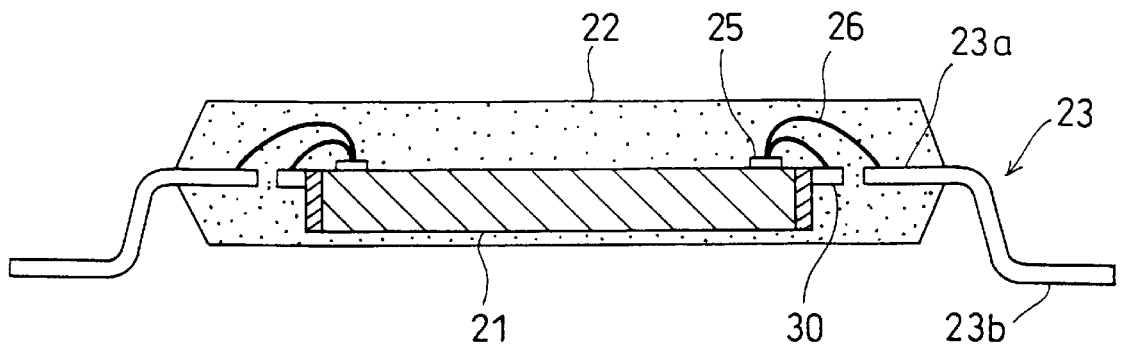
FIG. 23 is a cross-sectional view showing the third conventional semiconductor device.

FIGS. 20A through 20E are views showing variations of the distal ends 4a, 4a of the fixing leads 4, 4. FIG. 20A shows a distal end 4a bent perpendicularly from the fixing lead 4, the distal end 4a further consisting of two bifurcated plates being normal with each other so that the semiconductor chip 1 is brought into contact at its corner with these two bifurcated plates. FIG. 20B shows a distal end 4a bent at a dull angle from the fixing lead 4 and having a cutout formed at the lower end thereof. FIG. 20C shows an angled distal end 4a bent perpendicularly from the fixing lead 4, the angled distal end 4a being formed into an L shape when seen in the plan view. Thus, the semiconductor chip 1 is brought into contact at its corner with the two surfaces of the angled distal end 4a. FIG. 20D shows a distal end 4a bent perpendicularly from the fixing lead 4 which in brought into contact with the corner ridge of the semiconductor chip 1. FIG. 20E shows bifurcated two distal ends bent from the fixing lead 4 and extending along two surfaces forming a corner of the semiconductor chip 1. Thus, the semiconductor chip 1 is brought into contact at its corner with the surfaces of the bifurcated two distal ends. Configuration of the distal end 4a of the fixing lead 4 should be optimized by taking account of manufacturing cost, supporting strength of the semiconductor chip 1, layout in the design of the lead frame etc.

Although the above-explained embodiments show the fixing leads 4, 4, - - - as having a function of supporting the semiconductor chip 1, it will be preferable that the fixing lead has a function of a ground lead too.

Although the above-described embodiments show the bonding wire 6 connecting the internal lead 3a of the connecting lead 3 with the aluminum electrode 5 of the semiconductor chip 1, it will be possible to replace the bonding wire 6 with a solder or aluminum bump to directly connect the electrodes, or anisotropic conductive resin or the like.

Furthermore, although the above-described embodiments employ the LOC arrangement which allows the internal leads 3a, 3a, - - - of the connecting leads 3, 3, - - - to extend above and along the main surface of the semiconductor chip 1, it is needless to say that an ordinary arrangement which necessitates the internal leads 3a, 3a, - - - of the connecting leads 3, 3, - - - to position in the outer periphery of the semiconductor chip 1.

As this invention may be embodied in several forms without departing from the spirit of essential characteristics thereof, the present embodiments as described are therefore intended to be only illustrative and not restrictive, since the scope of the invention is defined by the appended claims rather than by the description preceding them, and all changes that fall within the metes and bounds of the claims, or equivalents of such metes and bounds, are therefore intended to be embraced by the claims.

What is claimed is:

1. A semiconductor device comprising:

a semiconductor chip;

a plurality of connecting leads which had extended inward from a lead frame main body, which are separated from said lead frame main body, and which are electrically connected with an electrode of said semiconductor chip;

a plurality of fixing leads which had extended inward from said lead frame main body so as to be close to one another, which are separated from said lead frame main body, each of said fixing leads making a pair with another fixing lead confronting the fixing lead for supporting said semiconductor chip; and a resin package sealing said semiconductor chip, said connecting leads and said fixing leads, wherein said fixing leads have respective distal ends bent at approximately right angles to a main surface of said semiconductor chip, each of said distal ends making a pair with another distal end confronting the distal end; and said fixing leads support said semiconductor chip by clamping said semiconductor chip with said paired distal ends.

2. The semiconductor device in accordance with claim 1, wherein said connecting leads have internal leads extending above and along a main surface of said semiconductor chip and electrically connected to said electrode of the semiconductor chip.

3. The semiconductor device in accordance with claim 1, wherein each of said paired distal ends which confront each other supports a side surface or a corner of said semiconductor chip.

4. The semiconductor device in accordance with claim 3, wherein each of said paired distal ends which confront each other has a surface brought into contact with the side surface or the corner of said semiconductor chip.

5. The semiconductor device in accordance with claim 3, wherein soft metal or an elastic member is interposed between said distal end of the fixing lead and the side surface of said semiconductor chip.

6. The semiconductor device in accordance with claim 3, wherein said distal end of the fixing lead is connected with the side surface of said semiconductor chip by resin or low melting point metal.

7. The semiconductor device in accordance with claim 3, wherein said distal end of the fixing lead is connected with the side surface of said semiconductor chip by adhesive insulating film.

8. The semiconductor device in accordance with claim 3, wherein said fixing lead serves as a ground lead.

9. The semiconductor device in accordance with claim 1, wherein said distal end of the fixing lead supports a corner of said semiconductor chip.

10. The semiconductor device in accordance with claim 9, wherein said distal end of the fixing lead is an angled plate formed into an L shape when seen in the plan view, said angled plate supporting the corner of the semiconductor chip.

11. The semiconductor device in accordance with claim 9, wherein soft metal or an elastic member is interposed between the distal end of the fixing lead and the corner of the semiconductor chip.

12. The semiconductor device in accordance with claim 9, wherein said distal end of the fixing lead is connected with the corner of said semiconductor chip by resin or low melting point metal.

13. The semiconductor device in accordance with claim 9, wherein said fixing lead serves as a ground lead.

* * * * *